(12) United States Patent
Walker, Jr. et al.

(10) Patent No.: US 6,465,774 B1
(45) Date of Patent: Oct. 15, 2002

(54) METHOD AND SYSTEM FOR VERSATILE OPTICAL SENSOR PACKAGE

(75) Inventors: Harold Young Walker, Jr., Plano; James Kenneth Guenter, Garland, both of TX (US)

(73) Assignee: Honeywell International Inc., Morristown, NJ (US)

( * ) Notice: Subject to any disclaimer, the term of this patent is extended or adjusted under 35 U.S.C. 154(b) by 264 days.

(21) Appl. No.: 09/607,048

(22) Filed: Jun. 30, 2000

(51) Int. Cl.[7] .................................................. H01S 5/02
(52) U.S. Cl. ...................... 250/239; 250/214.1; 250/216
(58) Field of Search ............................. 250/239, 214.1, 250/216; 257/80, 81, 82, 83, 84, 85, 431, 432, 433, 434, 435

(56) References Cited

U.S. PATENT DOCUMENTS

| 5,013,911 A | 5/1991 | Koshida et al. |
| 5,270,869 A | 12/1993 | O'Brien et al. |
| 5,444,520 A | 8/1995 | Murano |
| 5,650,612 A | 7/1997 | Criswell et al. |
| 5,821,532 A | * 10/1998 | Beaman et al. ............. 250/239 |
| 6,313,460 B1 | 11/2001 | Haas et al. |

FOREIGN PATENT DOCUMENTS

EP          0 720 014 A1     7/1996

* cited by examiner

Primary Examiner—Hung Xuan Dang
(74) Attorney, Agent, or Firm—Andrew A. Abeyta; Luis M. Ortiz

(57) ABSTRACT

A versatile optical sensor method and assembly (200) is disclosed, providing cost-effective and readily adaptable optical sensor packaging while minimizing product variance, and comprising an integrally molded or single foundation piece (202) formed with a light source housing (302), a lens alignment feature (304) surrounding the light source housing, a mounting alignment feature (210), a sensor housing (206), and a barrier feature (204), further comprising a light source member (300) mounted to the foundation piece within the light source housing, a single lens member (214) enclosing the light source member and formed to engage with the lens alignment feature, and a detector member (208) mounted to the foundation piece within the sensor housing.

26 Claims, 3 Drawing Sheets

METHOD AND SYSTEM FOR VERSATILE OPTICAL SENSOR PACKAGE

BACKGROUND OF THE INVENTION

The present invention relates, in general, to optical sensors utilizing vertical cavity surface emitting lasers (VCSELs), and in particular, to a method and system for efficient and versatile packaging of such optical sensors.

The Vertical Cavity Surface Emitting Laser (VCSEL) is rapidly becoming a workhorse technology for semiconductor optoelectronics. VCSELs can typically be used as light emission sources anywhere other laser sources (e.g., edge emitting lasers) are used and provide a number of advantages to system designers. Hence, VCSELs are emerging as the light source of choice for modern high volume applications such as optical encoders, reflective/transmissive sensors and optical read/write applications. Inherently low cost of manufacture, enhanced reliability, non-astigmatic and circularly symmetric optical output are just some of the advantages of VCSELs over traditional laser sources.

In many sensor applications, an optical sensor assembly scatters laser light off a surface and detects motion of the resulting optical speckle pattern through its movement across detectors disposed adjacent to the laser source or in some other convenient location exposed to the scattered light. The sensed motion can be in one or more axes, and the scattering surface can have many configurations, for example, a sphere, a cylinder, a plane, etc.

Typically, conventional optical sensor assemblies are produced using printed circuit board (PCB) or substrate-type materials with conventional surface mount processes and methods. The number and variety of assembly and alignment steps of such sensors must typically be done without the aid of mechanical locating features, and every feature must be affixed in a separate process. Such assembly processes are typically cost inefficient and generally produce optical sensors with undesirable tolerances and variances.

One example of such an assembly is illustrated in reference to FIGS. 1a and 1b, which depict front and rear side views of a VCSEL PCB assembly 100, respectively. In assembly 100, a VCSEL chip was mounted in a surface-mount component 102, which had a lens 104 as one of its piece parts. The lens 104 was attached in a solder process, and surface tension alone aligned it to component 102. Typically, this alignment process was not very efficient or accurate. Size constraints of the packaging and processes typically forced the VCSEL chip to be in close proximity to lens 104, resulting in angle of the exit beam varying as a function of chip position. The surface-mount component 102 was subsequently mounted to a conventional PCB 106. This operation typically led to additional misalignments, both through tilting of the component and through mispositioning.

Typically, positioning of such an assembly to pins within an end-equipment housing was controlled by three drilled alignment holes 108. This resulted in further board-to-board variability. In fact, the pointing angle of the beam was typically so far from the intended axis that corrective rework was required, such as tilting the board by placing a shim over the appropriate hole. The remainder of the front side of assembly 100 included an individually mounted chip resistor 110 to set VCSEL power, two detector chips 112, and a ceramic spacer 114 added to the board to protect the detectors 112 and their bond wires from handling damage. On the rear surface of the board, high-temperature solder bumps 116 were typically formed in a separate operation. These bumps 116 were typically used as spatial stand-offs for positioning in the end equipment assembly. Additionally, the rear of the board may have had other structures, such as a metal disk and annulus (not shown), to provide end equipment functionality (e.g., to form conductors for a pressure sensitive button). Typically, these structures would be formed using thick, wire-bondable gold or another similar material which would often abrade and wear with use.

Thus, conventional methods and apparatus have required a variety of assembly and alignment steps, typically done without the aid of mechanical locating features, and typically affixing every feature in a separate process. Such assemblies and processes typically yield optical sensors with undesirable tolerances and variances in a cost inefficient manner. These approaches have further added to the production costs of sensor components and often change the electrical characteristics of the component, yielding different reliability and new characterization data for each component, reducing economies of scale in high volume sensor production.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

Versatile methods and apparatus for packaging optical sensors in a cost-effective and readily adaptable manner, while minimizing product variance, are needed, providing reduced optical variability and reduced misalignment sensitivity and an efficient production process while overcoming the aforementioned limitations of conventional methods.

In the present invention an optical sensor assembly is produced utilizing a single foundation piece formed with a light source housing, a lens alignment feature surrounding the light source housing, a mounting alignment feature, a sensor housing, and a barrier feature, a light source member mounted to the foundation piece within the light source housing, a single lens member enclosing the light source member and formed to engage with the lens alignment feature, and a detector member mounted to the foundation piece within the sensor housing.

In another embodiment of the present invention, a method of producing an optical sensor assembly is taught. The method comprises the steps of forming a foundation piece having a light source housing, a lens alignment feature surrounding the light source housing, a mounting alignment feature, a sensor housing, and a barrier feature, coupling a light source member to the foundation piece within the light source housing, forming a single lens member to enclose the light source member and engage with the lens alignment feature, coupling the lens member to the foundation piece, and coupling a detector member to the foundation piece within the sensor housing.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

It should be understood that the principles and applications disclosed herein can be applied in a wide range of optoelectronic applications. For purposes of explanation and illustration, the present invention is hereafter described in reference to an optical sensor assembly using a VCSEL light source. However, the present invention can be applied in other conventional optical component applications that require iterative or inefficient assembly using surface mount processes and methods.

Figure 1A:
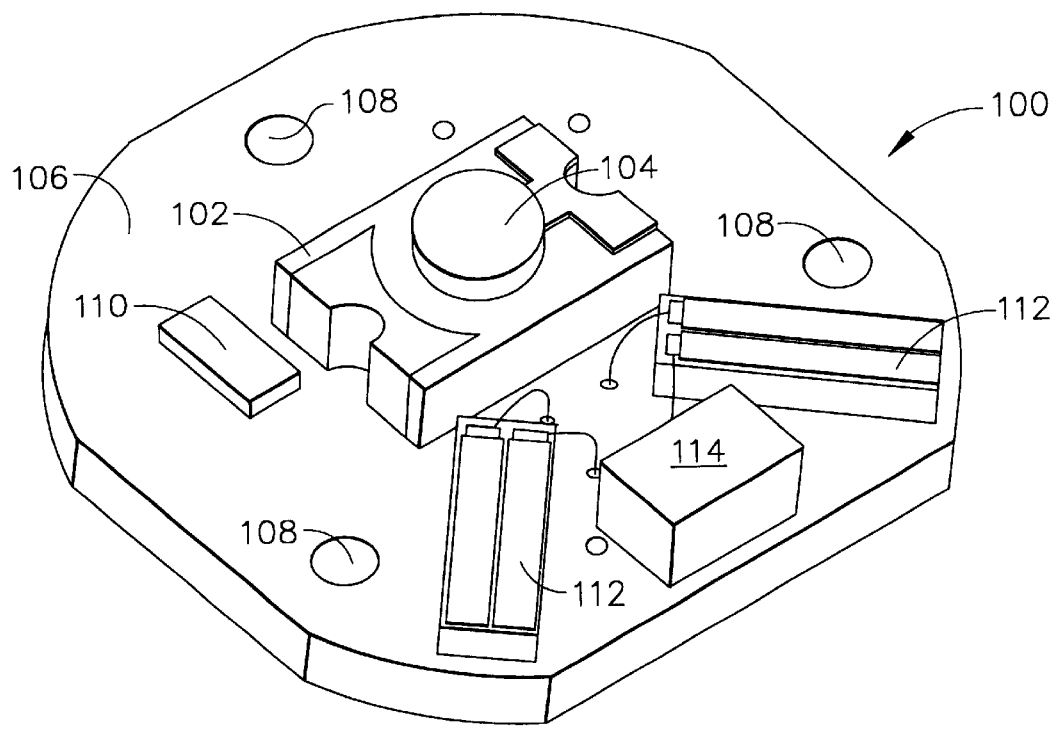
FIGS. 1a and 1b depict a prior art optical sensor assembly.
Figure 1B:
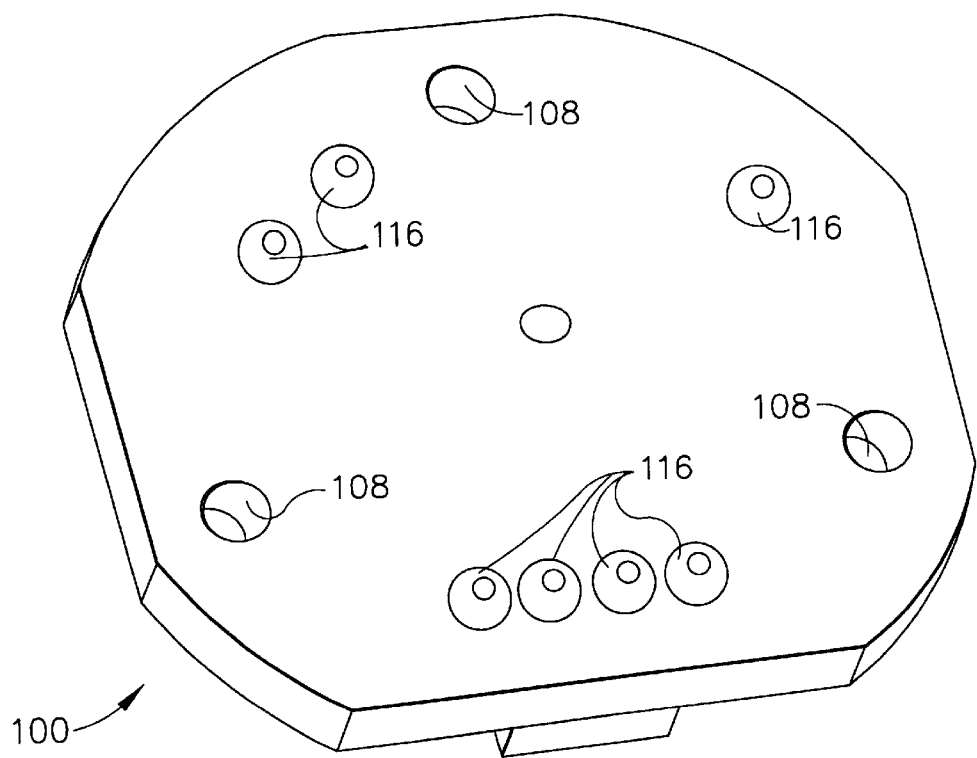
Figure 2A:
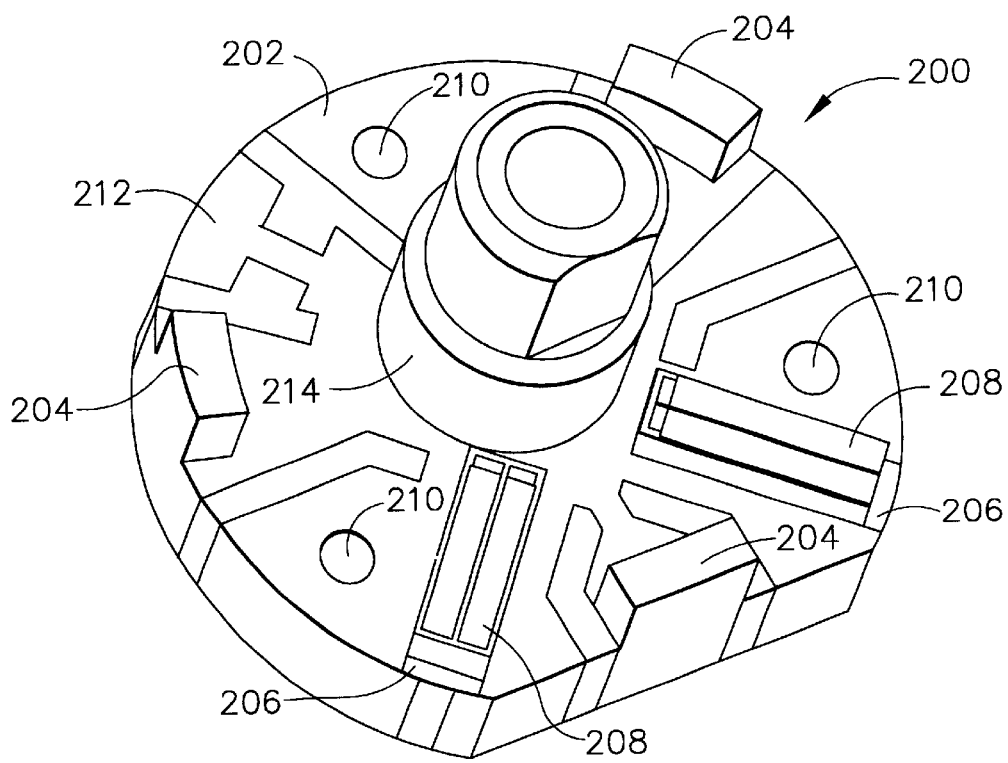
FIGS. 2a and 2b are illustrative schematics of an optical sensor assembly according to the present invention.
Figure 2B:
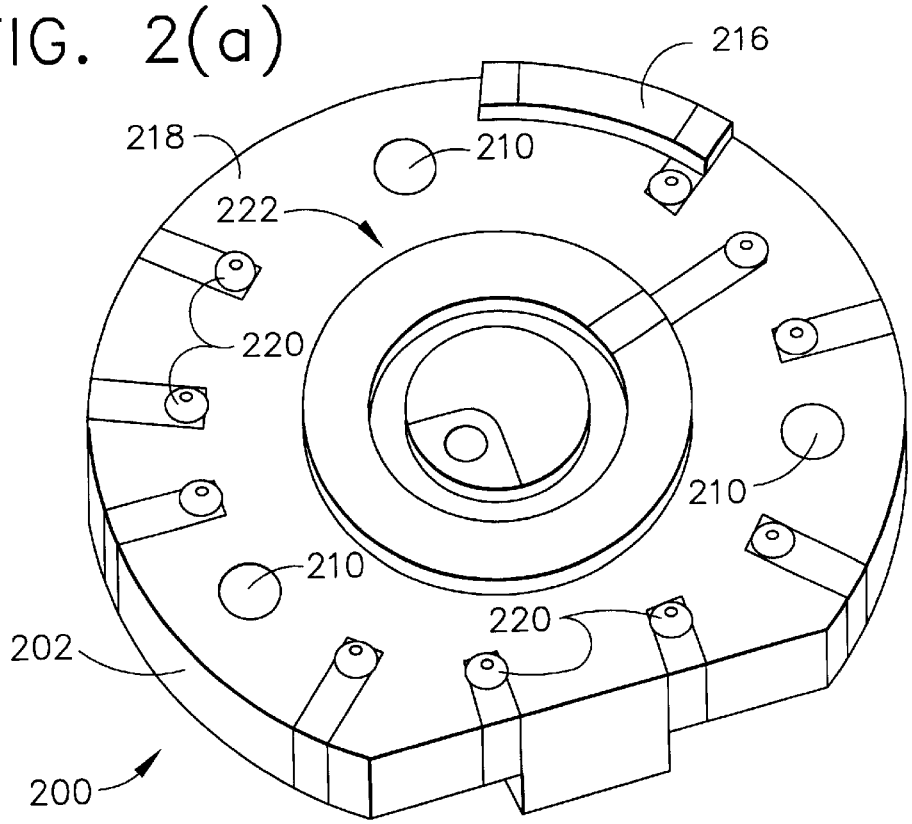

Reference is now made jointly to FIGS. 2a and 2b, which depict front and rear views of an optical sensor assembly 200 according to the present invention, respectively. The present invention provides a single formed foundation piece 202, such as an injection-molded PCB, incorporating many features that conventional designs required separate processes and components to produce. Piece 202 incorporates additional features, such as precise alignment members, while replacing conventional PCBs and substrates previously used. More specifically, piece 202 comprises one or more protective barriers 204 (spacers or extensions) formed thereon. Piece 202 comprises one or more sensor housings 206 to or within which one or more sensor members 208 can be mounted. Piece 202 further comprises a number of mounting alignment features 210 formed therein or thereon, as well as one or more mounting pads 212 to which optional chip resistors or other components can be mounted. Because these features are produced in a single step and to precise molding tolerances, the overall optical variability of the assembly is reduced. The present invention further provides optics having an increased chip-to-lens spacing and an aspheric optical element, also injection molded and incorporating precise alignment features, further reducing the sensitivity to misalignment. As shown in FIG. 2a, piece 202 has removable lens member 214 (one or more) attached thereto. Referring to FIG. 2b, a trimmable resistor 216 is patterned on the rear surface 218 as an integral part of assembly 200. Piece 202 also comprises a light source housing and lens alignment features, described in further detail with reference now to FIG. 3.

Figure 3:
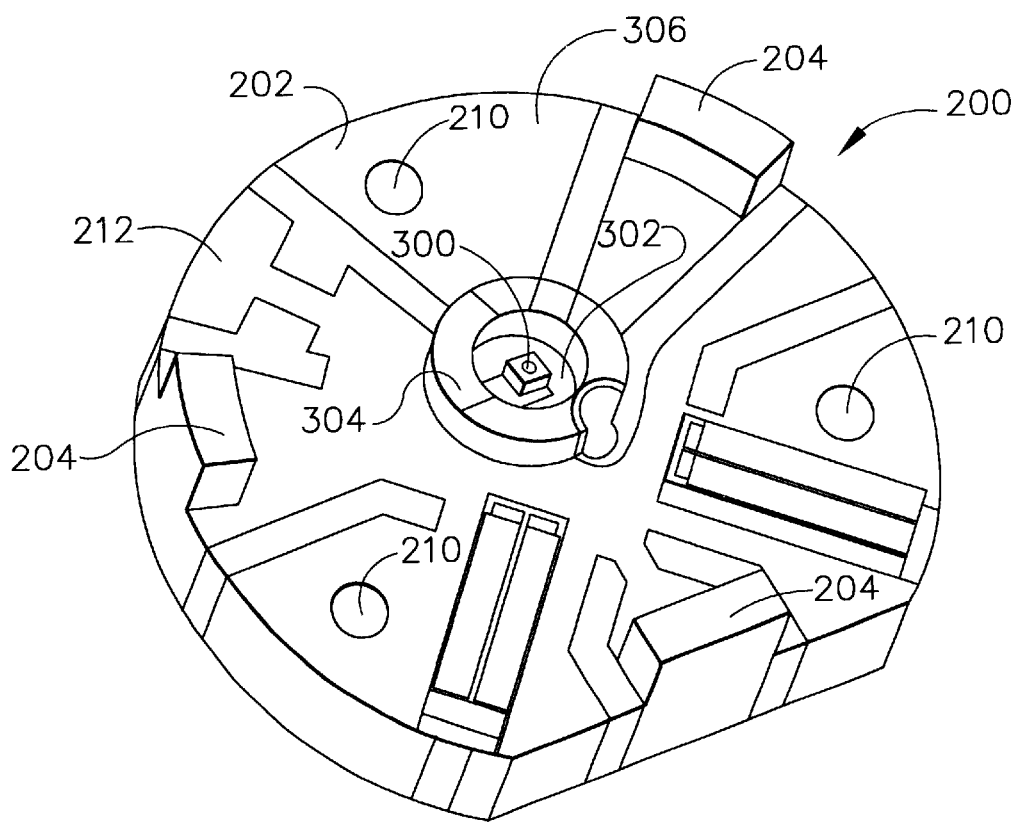
FIG. 3 is another illustrative schematic of an optical sensor assembly according to the present invention.

Referring to FIG. 3, a VCSEL chip 300 is mounted directly to a housing feature 302 formed within or on piece 202 (shown with lens member 214 removed), without an intermediate component, making tilt of that component moot. Piece 202 comprises a lens alignment member 304 formed thereon or therein around the VCSEL housing 302. As depicted, member 304 is a lens alignment ring, although other suitable constructs can be employed as will become apparent to those skilled in the art. Alignment holes 210 for end equipment assembly are molded at the same time as the lens alignment ring 304, resulting in near-perfect alignments. Although three alignment holes 210 are shown, any number of holes can be employed depending upon the application. One or more spacers 204 are molded into piece 202, resulting in a more robust assembly as well as reducing assembly time and labor. Pads 212 for a chip resistor or other component are provided on the front surface 306 of piece 202, but such a component is optional because trimmable resistor 216 is patterned on rear surface 218 (see FIG. 2b).

Referring jointly to FIGS. 2a, 2b, and 3, because the entire structure of foundation piece 202 is integrally molded unitarily or singularly, solder bumps are unnecessary. Similar bumps 220 can be formed or molded in piece 202 as shown in FIG. 2b. In addition, rear surface 218 can comprise members such as a metal disk and annulus 222 to form functional features, such as conductors for a pressure sensitive button, in an end equipment assembly. Because these features can be subject to repeated abrasion, the thick, wire-bondable gold used in a conventional assembly of this sort can be replaced with a harder palladium plating or other suitable material. Thus, annulus 222 can also be integrally formed in piece 202 but with an abrasion-resistant surface formed of the same or similar material as trimmable resistor 216, allowing the remainder of the conductor surfaces to be thick, wire-bondable gold.

Figure 4A:
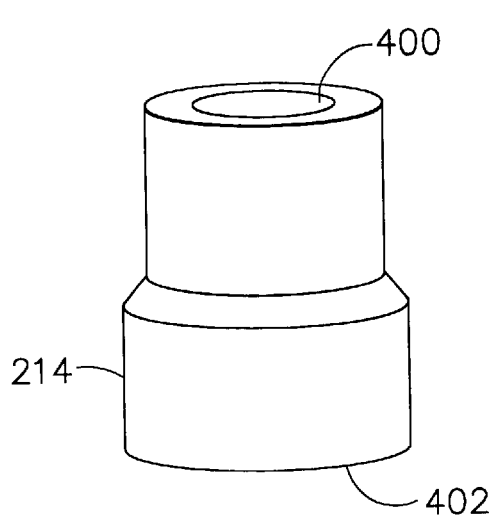
FIGS. 4a and 4b are an illustrative diagram of an optical component in accordance with the present invention.
Figure 4B:
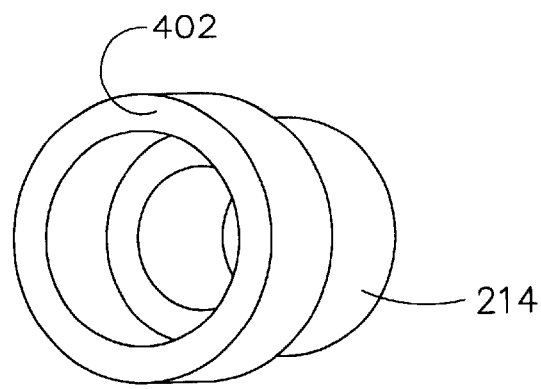

Referring now jointly to FIGS. 4a and 4b, side and bottom plan views of a lens member 214 are depicted, respectively. Due to the positioning of the optical element 400 relative to the bottom edge 402, the lens member 214 of the present invention provides optics having an increased chip-to-lens spacing and can provide an aspheric optical element 400, which can also be injection molded in a single piece and incorporate precise alignment features, further reducing the sensitivity to misalignment.

Others uses of the teachings of the present invention include any assembly where a light source, such as a laser or an LED, must be focused on a particular location at a distant surface and the returned (scattered or reflected) light must fall on detectors with a precise location relative to both the source and the distant surface. The concepts of assured alignments, robust optics, integral protection for the optics, and integral control mechanisms (such as the trimmable resistor), can lead to cost savings in any such environment.

The embodiments and examples set forth herein are presented to best explain the instant invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive nor to limit the scope of the invention. Many modifications and variations are possible in light of the above teaching without departing from the spirit and scope of the following claims.

It is contemplated that the use of the present invention can involve components having different characteristics. It is intended that the scope of the present invention be defined by the claims appended hereto, giving full cognizance to equivalents in all respects.

The embodiments of an invention in which an exclusive property or right is claimed are defined as follows:

1. An optical sensor assembly comprising:
    a foundation piece formed with a light source housing, a lens alignment feature it surrounding at least a portion of the light source housing, a mounting alignment feature, a sensor housing, and a barrier feature;
    a light source member mounted to the foundation piece within the light source housing; and
    a lens member enclosing the light source member and formed to engage with the lens alignment feature.

2. The assembly of claim 1 further comprising a detector member mounted to the foundation piece within the sensor housing.

3. The assembly of claim 1, wherein the foundation piece comprises a front surface and a rear surface.

4. The assembly of claim 3, wherein the light source housing, the sensor housing, and the lens alignment and barrier features are formed within the front surface.

5. The assembly of claim 4 further comprising a resistive element formed on the foundation piece.

6. The assembly of claim 5, wherein the barrier feature is formed proximal to the sensor housing.

7. The assembly of claim 6, wherein the foundation piece is an injection molded printed circuit board.

8. The assembly of claim 5, wherein the light source member comprises a laser source.

9. The assembly of claim 8, wherein the laser source is a vertical cavity surface emitting laser.

10. The assembly of claim 5, wherein the light source member comprises a light emitting diode.

11. The assembly of claim 1, wherein the lens member comprises an aspherical optical element.

12. The assembly of claim 1, wherein the lens member comprises a spherical optical element.

13. The assembly of claim 1, wherein the mounting alignment feature comprises an aperture formed in the foundation piece.

14. A method of producing an optical sensor assembly, the method comprising the steps of:
    forming a foundation piece having a light source housing, a lens alignment feature surrounding the light source housing, a mounting alignment feature, a sensor housing, and a barrier feature;
    coupling a light source member to the foundation piece within the light source housing;
    forming a lens member to enclose the light source member and engage with the lens alignment feature; and
    coupling the lens member to the foundation piece.

15. The method of claim 14, further comprising the step of coupling a detector member to the foundation piece within the sensor housing.

16. The method of claim 15, wherein the step of forming the foundation piece further comprises forming the foundation piece with a front surface and a rear surface.

17. The method of claim 16, wherein the light source housing, the sensor housing, and the lens alignment and barrier features are formed within the front surface.

18. The method of claim 17 further comprising the step of forming a resistive element on the foundation piece.

19. The method of claim 18, wherein the step of coupling the light source member comprises coupling a laser source.

20. The method of claim 18, wherein the step of coupling the light source member comprises coupling a light emitting diode.

21. The method of claim 18, wherein the step of coupling the light source member comprises coupling a vertical cavity surface emitting laser.

22. The method of claim 17, wherein the barrier feature is formed proximal to the sensor housing.

23. The method of claim 22, wherein the foundation piece is formed by injection molding.

24. The method of claim 15, wherein the lens member is formed with an aspherical optical element.

25. The method of claim 15, wherein the lens member is formed with a spherical optical element.

26. The method of claim 14, wherein the mounting alignment feature is formed as an aperture in the single foundation piece.

* * * * *